United States Patent
Shin et al.

(10) Patent No.: US 6,465,321 B1
(45) Date of Patent: Oct. 15, 2002

(54) METHOD OF FORMING A STORAGE NODE IN A SEMICONDUCTOR DEVICE

(75) Inventors: Hyeon Sang Shin, Ichon-Shi; Chang Heon Park, Seoul; Myung Pil Kim, Bukcheju-Gun, all of (KR)

(73) Assignee: Hyundai Electronics Industries Co., Ltd., Ichon-Shi (KR)

( * ) Notice: Subject to any disclaimer, the term of this patent is extended or adjusted under 35 U.S.C. 154(b) by 0 days.

(21) Appl. No.: 09/722,505

(22) Filed: Nov. 28, 2000

(30) Foreign Application Priority Data

Dec. 22, 1999 (KR) ................................ 99-60549

(51) Int. Cl.[7] .............................................. H01L 21/20
(52) U.S. Cl. ................... 438/396; 438/253; 438/652; 438/673
(58) Field of Search .................. 438/253, 254, 438/396, 397, 652–654, 259, 673, 734, 738, 720; 216/51, 13

(56) References Cited

U.S. PATENT DOCUMENTS

| 3,833,435 | A | | 9/1974 | Logan et al. |
|---|---|---|---|---|
| 5,478,772 | A | | 12/1995 | Fazan |
| 5,650,040 | A | | 7/1997 | New |
| 5,789,323 | A | | 8/1998 | Taylor |
| 5,879,985 | A | | 3/1999 | Gambino et al. |
| 5,918,110 | A | | 6/1999 | Fuchs et al. |
| 5,930,639 | A | * | 7/1999 | Schuele et al. ............. 438/396 |
| 6,025,620 | A | | 2/2000 | Kimura et al. |
| 6,036,875 | A | * | 3/2000 | Lin ............................. 216/51 |
| 6,277,702 | B1 | * | 8/2001 | Chun et al. ................. 438/396 |

FOREIGN PATENT DOCUMENTS

| JP | 5-144781 | | 6/1993 | |
|---|---|---|---|---|
| JP | 8250503 | * | 9/1996 | ....... H01L/21/3213 |
| JP | 8-250503 | | 9/1996 | |
| JP | 10-340893 | | 12/1998 | |
| JP | 10340893 | * | 12/1998 | ....... H01L/21/3065 |

* cited by examiner

Primary Examiner—Olik Chaudhuri
Assistant Examiner—Yennhu B. Huynh
(74) Attorney, Agent, or Firm—Finnegan, Henderson, Farabow, Garrett, & Dunner, L.L.P.

(57) ABSTRACT

There is disclosed a method of forming a storage node in a semiconductor device capable of forming a storage node in a vertical structure, by forming a hard mask used to form a noble storage node using a TiN film deposited in a spacer shape on an oxide film and over the oxide film.

13 Claims, 1 Drawing Sheet

METHOD OF FORMING A STORAGE NODE IN A SEMICONDUCTOR DEVICE

CROSS-REFERENCE TO RELATED APPLICATION

Priority is claimed from Republic of Korean Patent Application No. 99-60549 filed Dec. 22, 1999, which is incorporated in its entirety by reference.

BACKGROUND OF THE INVENTION

1. Field of the Invention

The invention relates generally to a method of forming a storage node in a semiconductor device. More particularly, the present invention relates to a method of forming a storage node in a semiconductor device capable of forming a conductive film storage node in a vertical structure, by forming a hard mask used to form a noble metal storage node using a TiN film deposited on an oxide film and over said oxide film.

2. Description of the Prior Art

In a semiconductor device, the capacitance of a capacitor may be represented as a value proportional to the dielectric constant of a dielectric film between the surface area of an electrode and an electrode as shown in Equation 1.

$$C = \in A/d \quad \text{[Equation 1]}$$

where $\in$ indicates a dielectric constant, A indicates the surface area and d indicates the thickness of a dielectric film.

Therefore, in the process of manufacturing a semiconductor device that is gradually fined, in order to secure a capacitance more than a given amount by which the semiconductor device can be properly operated, various methods by which a storage node is formed in a three dimensional structure to increase the surface area of the storage node or a high dielectric material such as BST having a high dielectric constant is used to secure a capacitance, etc. have been researched. As complicated process is required in order to form a storage node having a three-dimensional structure, however. there is a problem that the throughput is lowered since the manufacturing cost is increased and the number of the process is increased. Also, if the BST high dielectric is used, there is a problem the leakage current characteristic is degraded since it is difficult to strictly maintain an oxygen stoichiometry. Further, in case of a capacitor using BST as a dielectric film, a noble metal such as Pt having a large anti-oxidization, etc. must be used. However, this material has the problems that not only it is difficult to be etched since it is very stable but also it is difficult to obtain a vertical profile since etching is performed by physical sputtering.

Therefore, conventionally, in order to obtain a vertical profile, a method by which a hard mask is formed of TiN or oxide film in order to etch Pt and etching is performed using the mask at high temperature has been attempted. However, the method has drawbacks that the scattering effect of ions could be used because the hard mask formed of TiN could not be formed at high height in view of deposition characteristic and the hard mask formed of the oxide film is eroded during etching process since it has a poorer selective ratio than the hard mask formed of TiN.

SUMMARY OF THE INVENTION

It is therefore an object of the present invention to provide. a method of forming a storage node in a semiconductor device by which a storage node of a vertical profile can be formed, using a mask that can solve the problems of the conventional hard mask formed of TiN or oxide film.

In order to accomplish the above object, a method of forming a storage node in a semiconductor device according to the present invention is characterized in that it comprises the steps of forming an interlayer insulating film on a semiconductor substrate in which a given structure is formed; after forming a contact hole through a given region of the semiconductor substrate is exposed by etching a given region of the interlayer insulating film, forming a plug burying the contact hole; sequentially forming a conductive film and an oxide film on the entire structure; after patterning the oxide film. forming a TiN film on the oxide film and thus forming a hard mask of an oxide film and TiN film structure; patterning the conductive film by etching process using the hard mask to form a storage node; and removing the hard mask.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Figure 1A:
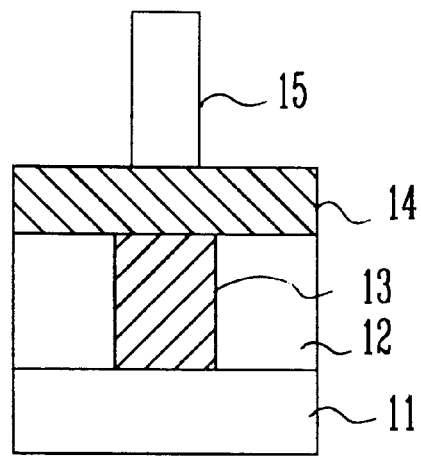
FIGS. 1A to 1C are cross-sectional views of a device for explaining a method of forming a storage node in a semiconductor device according to the present invention.
Figure 1B:
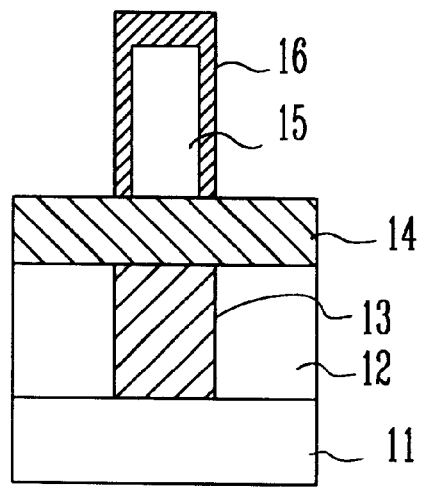
Figure 1C:
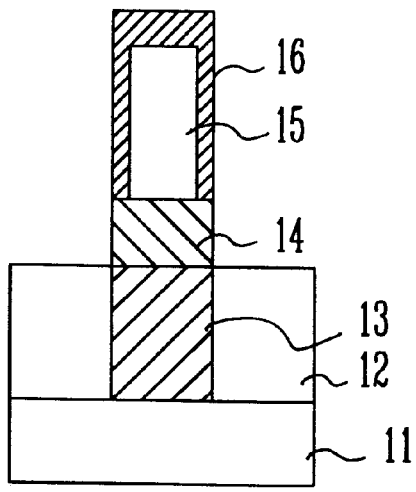

FIGS. 1A to 1C are cross-sectional views of a device for explaining a method of forming a storage node in a semiconductor device according to the present invention.

Referring now to FIG. 1A, an interlayer insulating film 12 is formed on a semiconductor substrate 11 in which a given structure is formed, by implementing a given process of manufacturing a semiconductor device. Then, a given region of the interlayer insulating film 12 is etched form a contact hole through a given region of the semiconductor substrate 11 is exposed. Next, the contact hole is buried with, for example, a polysilicon film to form a plug 13. Thereafter, a conductive film 14 for forming a storage node of a capacitor is formed on the entire structure. At this time, the conductive film 14 may employs a noble metal such as Pt, etc. The, an oxide film 15 is formed on the conductive film 14 and is then patterned. The oxide film 15 is formed thicker about 1.5 times than the conductive film 14. Also, the oxide film pattern is formed smaller than the width of the storage node to be formed, which is formed as smaller as the width of a TiN film to be deposited later. Also, the etching of the oxide film 15 may be implemented at a low pressure of 5 m Torr below, using fluorine gas that not contains hydrogen radix, for example, gases such as $CF_4$, $C_2F_6$, etc.

FIG. 1B shows a cross-sectional view of a device in which after a TiN film 16 is formed on the entire structure, a TiN film 16 of a spacer structure is formed on the oxide film pattern by blanket-eth process, and a hard mask formed of the oxide film pattern 15 and the TiN film 16 is formed. Here, the Tin film 16 is deposited by PVD method, wherein the TiN film 16 formed on the oxide film pattern is thickly deposited more than two times than it bottom and sides by depositing the TiN film 16 using PVD method having low step coverage.

Referring now FIG. 1C, there is shown a cross-sectional view of a device in which a storage node is formed by etching the conductive film 14 by sputtering method using the hard mask. At this time, as HBr/O$_2$ gas having a higher selective ratio than the TiN film 16 is used etch gas, the hard mask is vertically etched by the interferential effect of ions due to aspect ratio of the hard mask without eroding the hard mask, in which the HBr/O$_2$ gas is in the range of 2:1~1:2. Also, when the conductive film 14 is etched by sputtering method, it is preferred that the ion energy is increased as possible as and a voltage of more than 1000V is maintained by DC self bias. Meanwhile, the etching of the conductive film 16 is implemented an ultra-low pressure below 2 mTorr, so that the residues of the conductive film etched due to the etching by sputtering can be smoothly ejected.

Also, the hard mask formed of the oxide film and the TiN film may be removed using HF at a time.

In the above, though the TiN film is formed on the oxide film pattern in order to form the hard mask, as another embodiment, a method of depositing an oxide film and a TiN film and then patterned then, forming a TiN film by CVD method and then implementing a blanket etching to a spacer TiN film may be also implemented.

As mentioned above, the present invention can etch a novel metal conductive film in a vertical structure by supplementing the drawback in the conventional hard mask that is used in the process of etching the noble metal storage node implemented by the conventional physical sputtering method. Therefore, the present invention has an effect that it does not apply a CD bias in an ultra-fine pattern process having a design rule of 0.1 µm below.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming a storage node in a semiconductor device, comprising:
   forming an interlayer insulating film on a semiconductor substrate;
   forming a contact hole through a selected region of said interlayer insulating film to expose a selected region of said semiconductor substrate, and subsequently forming a plug burying said contact hole;
   forming sequentially a conductive film and an oxide film on the structure;
   patterning said oxide film, and subsequently forming a TiN film on said patterned oxide film to form a hard mask of an oxide film and TiN film structure;
   patterning said conductive film, said patterning comprising an etching process using said hard mask to form a storage node; and
   removing said hard mask.

2. The method according to claim 1, wherein said conductive film comprises a noble metal.

3. The method according to claim 1, wherein patterning said oxide film comprises using a gas comprising fluorine at the pressure of 1 to 5 mTorr, wherein said gas does not contain hydrogen radix.

4. The method according to claim 3, wherein said gas comprises at least one of CF$_4$ and C$_2$F$_6$.

5. The method according to claim 1, wherein patterning said oxide film comprises forming a width of said oxide film smaller than a width of the subsequently formed storage node.

6. The method according to claim 1, wherein forming said TiN film comprises using a PVD method.

7. The method according to claim 1, wherein etching said conductive film comprises a sputtering method using at least one gas chosen from HBr and O$_2$ gases.

8. The method according to claim 7, comprising using HBr and O$_2$ gases in a ratio ranging from 2:1 to 1:2.

9. The method according to claim 7, wherein said sputtering method comprises using an ultra-pressure below 2 mTorr and a DC self bias of over 1000V.

10. The method according to claim 1, wherein removing said hard mask comprises removing said oxide film and said hard mask using HF.

11. A method of forming a storage node in a semiconductor device, comprising:
    forming an interlayer insulating film on a semiconductor substrate;
    forming a contact hole through a selected region of said interlayer insulating film to expose a selected region of said semiconductor substrate, and subsequently forming a plug burying said contact hole;
    forming sequentially a conductive film on the structure;
    forming a hard mask, said forming comprising depositing an oxide film and a TiN film and subsequently patterning said oxide and TiN films;
    patterning said conductive film, said patterning comprising an etching process using said hard mask to form a storage note; and
    removing said hard mask.

12. A method of forming a storage node in a semiconductor device, comprising:
    forming an interlayer insulating film on a semiconductor substrate;
    forming a contact hole through a selected region of said interlayer insulating film to expose a selected region of said semiconductor substrate, and subsequently forming a plug burying said contact hole;
    forming sequentially a conductive film and an oxide film on the structure;
    patterning oxide film, and subsequently forming a TiN film on said patterned oxide film to form a hard mask of an oxide film and TiN film structure;
    patterning said conductive film, said patterning comprising an etching process using said hard mask to form a storage node; and
    removing said hard mask;
    wherein said oxide film has a thickness of about 1.5 times greater than a thickness of said conductive film.

13. A method of forming a storage node in a semiconductor device, comprising:
    forming an interlayer insulating film on a semiconductor substrate;
    forming a contact hole through a selected region of said interlayer insulating film to expose a selected region of said semiconductor substrate, and subsequently forming a plug burying said contact hole;
    forming sequentially a conductive film and an oxide film on the structure;
    patterning said oxide film, and subsequently forming a TiN film on said patterned oxide film to form a hard mask of an oxide film and TiN film structure;
    patterning said conductive film, said patterning comprising an etching process using said hard mask to form a storage node; and removing said hard mask;

wherein the TiN film has an upper surface on top of said patterned oxide film and a side surface on the side of said patterned oxide film, a thickness of said upper surface being more than two times greater than a width of said side surface.

* * * * *

UNITED STATES PATENT AND TRADEMARK OFFICE
CERTIFICATE OF CORRECTION

PATENT NO.     : 6,465,321 B1                                    Page 1 of 1
DATED          : October 15, 2002
INVENTOR(S)    : Hyeon Sang Shin et al.

It is certified that error appears in the above-identified patent and that said Letters Patent is hereby corrected as shown below:

Column 4,
Line 31, "note" should read -- node --.

Signed and Sealed this

Eighth Day of July, 2003

JAMES E. ROGAN
*Director of the United States Patent and Trademark Office*